United States Patent [19]

Fujita

[11] 4,262,364

[45] Apr. 14, 1981

[54] ELECTRONIC DIGITAL CHANNEL-SELECTING APPARATUS

[75] Inventor: Masahiro Fujita, Kumagaya, Japan

[73] Assignee: Tokyo Shibaura Denki Kabushiki Kaisha, Kawasaki, Japan

[21] Appl. No.: 12,461

[22] Filed: Feb. 15, 1979

[30] Foreign Application Priority Data

Feb. 27, 1978 [JP] Japan .................................. 53-20832
Jul. 5, 1978 [JP] Japan .................................. 53-80855

[51] Int. Cl.³ ............................................ H04B 1/26
[52] U.S. Cl. ................................... 455/182; 455/185; 455/192; 455/259; 455/264
[58] Field of Search ............... 325/453, 464, 468, 418, 325/420–423; 334/16; 358/191, 195, 191.1, 195.1; 455/179, 182, 185, 186, 192, 257–259, 261, 263, 264

[56] References Cited

U.S. PATENT DOCUMENTS

| | | | |
|---|---|---|---|
| 4,004,231 | 1/1977 | Elshuber et al. | 325/420 |
| 4,079,320 | 3/1978 | Mogi | 325/464 |
| 4,127,822 | 11/1978 | Mogi et al. | 325/420 |
| 4,152,654 | 5/1979 | Tanaka | 325/464 |

FOREIGN PATENT DOCUMENTS 39-19524 9/1964 Japan ........................................ 325/464

Primary Examiner—Marc E. Bookbinder
Attorney, Agent, or Firm—Cushman, Darby & Cushman

[57] ABSTRACT

An electronic digital channel-selecting apparatus wherein a digital signal corresponding to a selected television channel is read out of a digital memory to be converted into an analog tuning voltage by a digital-analog converter; and the analog tuning voltage is applied to a voltage-controlled tuner which in turn is made to tune with the selected television channel. An AFT circuit is coupled to the tuner to detect its tuning condition. When the tuner does not accurately tune with the selected television channel, AFT clock pulses are supplied to an AFT counter to correct the analog tuning voltage depending on varying count numbers in the AFT counter. A clock changer is provided to switch AFT clock pulses having different frequencies such that the AFT clock pulses are successively applied to the AFT counter in the decreasing order of their frequencies during the AFT control.

16 Claims, 15 Drawing Figures

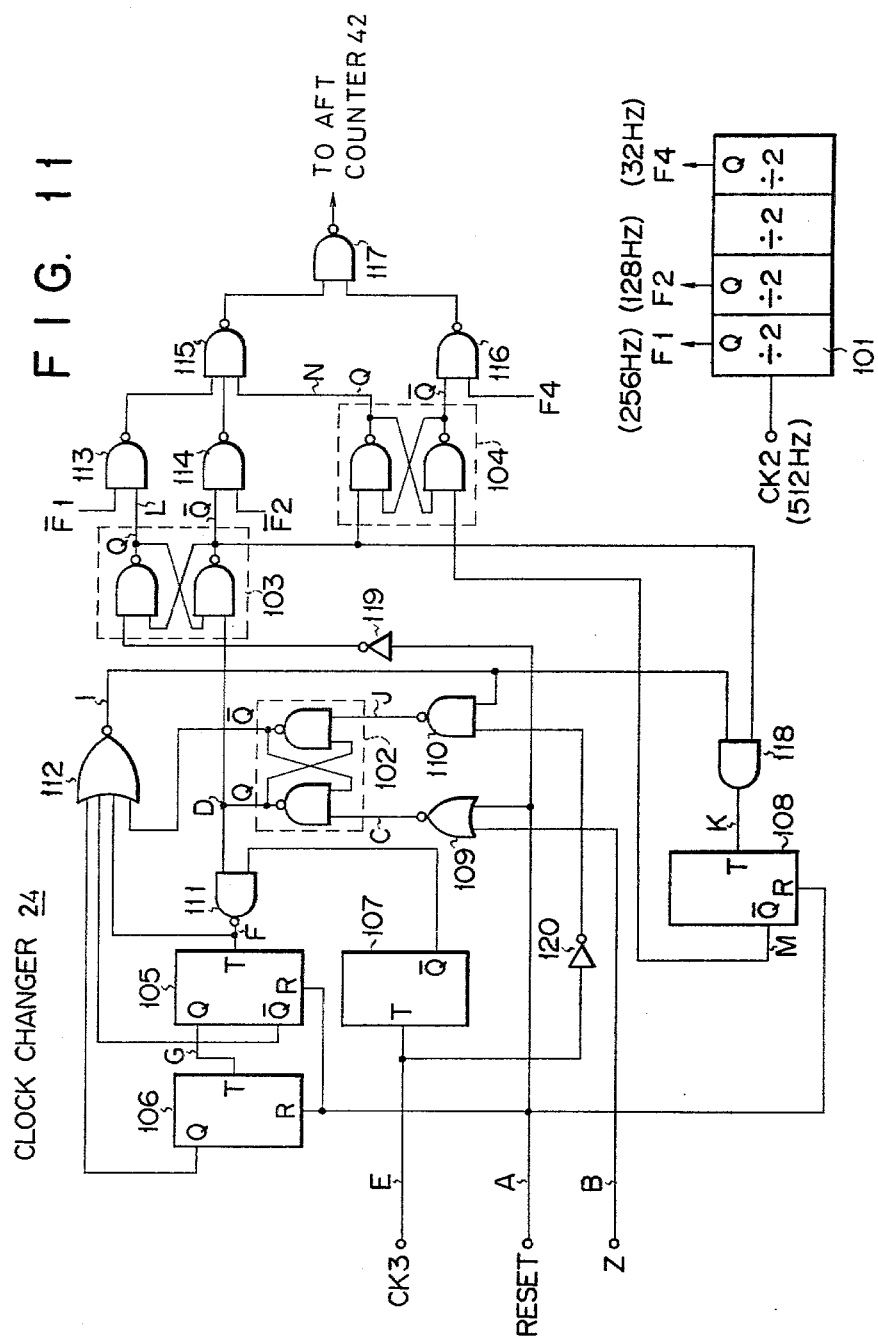

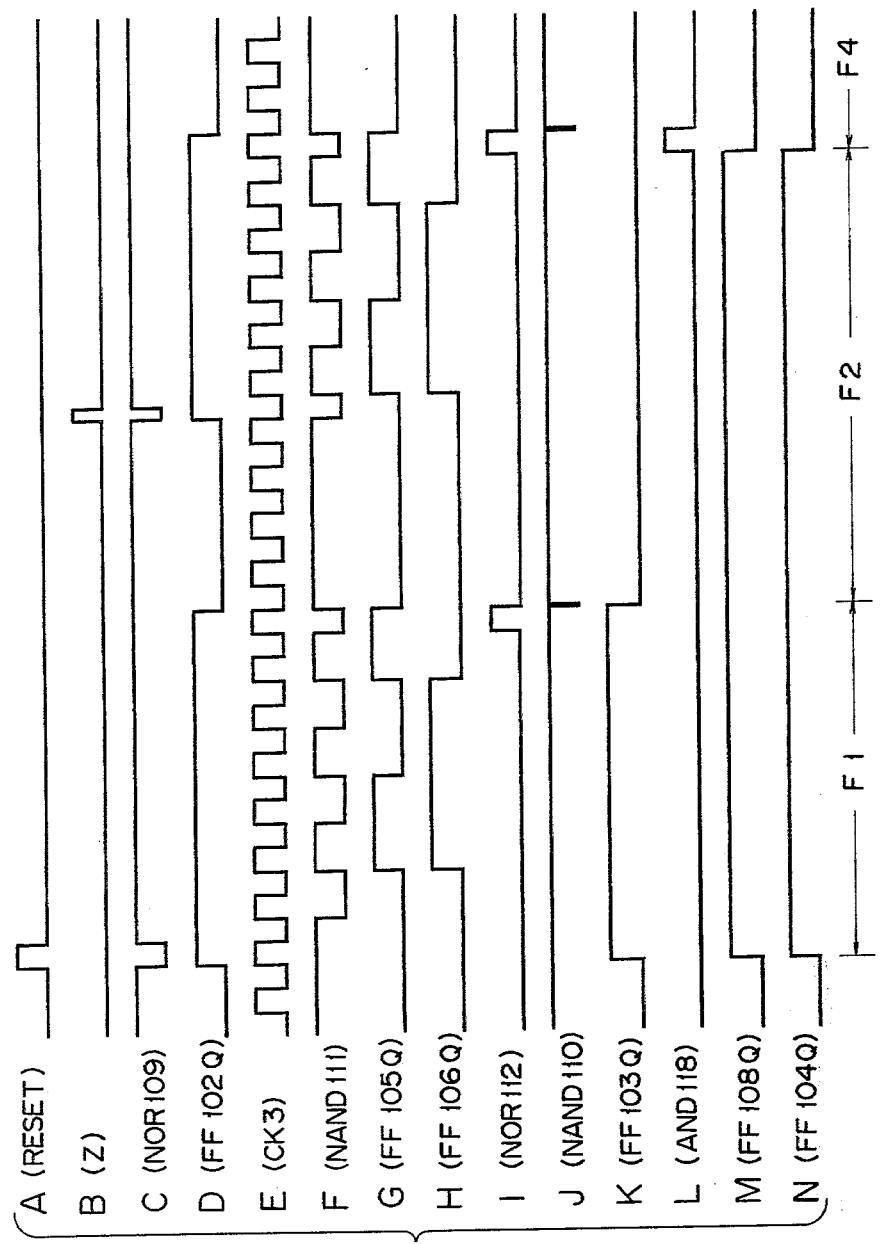

ELECTRONIC DIGITAL CHANNEL-SELECTING APPARATUS

This invention relates to an electronic digital channel-selecting apparatus for use with a television receiving set and the like.

With some television receiving sets now on the market, a tuner uses varactors acting as a voltage-controlled capacitors. With this varactor type tuner, a tuning voltage having a magnitude which has been preset by a potentiometer is impressed on the varactors in accordance with selection of a television channel in order to cause the tuner to tune with the picture carrier frequency of the selected television channel. Even with such varactor type tuner, in which drift generally occurs in the tuning elements, it is indispensable to undertake manual fine tuning control or automatic fine tuning (abbreviated as AFT) control in order to ensure accurate tuning between the tuner and the picture carrier frequency of the selected television channel.

Due to the recent progress in integrated circuit techniques, an electronic digital tuner is being developed which eliminates the application of potentiometers. With a digital tuner, digital data on a particular television channel is converted into an analog tuning voltage by a digital-analog converter. The analog tuning voltage is impressed on voltage-controlled tuning elements such as varactors to select the desired television channel. Even such digital tuner cannot dispense with the AFT control which is carried out in a digital manner.

In the digital AFT control, AFT clock pulses are counted by an AFT counter to minutely vary the magnitude of a tuning voltage supplied from a digital-analog converter to a voltage-controlled tuner. An AFT discriminator detects whether the output carrier frequency from a tuner represents a predetermined intermediate carrier frequency. Where coincidence takes place between the output carrier frequency and the predetermined intermediate carrier frequency, then the counting of the AFT counter is suspended to ensure accurate tuning between the tuner and the selected television channel.

The fundamental problem of the above-mentioned AFT control arises from the fact that the AFT discrimination circuit and the digital-to-analog converter have a slow response.

That is, when the rate of variation in the tuning voltage which depends on the frequency of AFT clocks is rapid, a timing in which the AFT discriminator detects coincidence between the aforesaid output carrier frequency of the tuner and the predetermined intermediate carrier frequency to produce a detection signal is delayed from a timing in which the output carrier frequency of the tuner is shifted to the predetermined intermediate carrier frequency.

When, therefore, the AFT discriminator detects the above-mentioned coincidence, the output carrier frequency of the tuner is already shifted due to the constantly varying tuning voltage, resulting in the necessity of further correcting the local oscillator frequency. Consequently, the up-and-down swing of a tuning voltage will occur. Though this difficulty may be resolved by lowering the frequency of clock pulse applied to the AFT counter, yet a relatively long time is consumed until the tuner accurately tunes to the picture carrier frequency of a selected television channel.

It is accordingly an object of this invention to provide an improved electronic digital channel-selecting apparatus which enables a tuner to correctly tune to a desired carrier frequency in a shorter time than when using a clock pulse having a low frequency by progressively lowering the frequency of clock pulse applied to an AFT counter during an AFT operation.

According to this invention, there is provided an electronic digital channel-selecting apparatus comprising: memory means for storing digital signals corresponding to a plurality of channels of which a digital signal representing a selected channel is read out in response to selection of the channel; digital-to-analog conversion means coupled to said memory means for converting the digital signal read out of said memory means into an analog tuning voltage; voltage-controlled tuner means coupled to said digital-to-analog conversion means for converting a received carrier frequency on the selected channel into a predetermined intermediate carrier frequency, said voltage-controlled tuner means being responsive to tuning voltages of different magnitudes to tune to different carrier frequencies on different channels and controllable to correctly tune to the carrier frequency on a selected channel by a tuning voltage varying for an automatic fine tuning (AFT) control; AFT circuit means coupled to said voltage-controlled tuner means for detecting whether an output carrier frequency of said tuner means coincides with the predetermined intermediate carrier frequency, a timing in which said AFT circuit means detects that the output carrier frequency of said tuner means coincides with the predetermined intermediate carrier frequency being delayed from a timing in which the output carrier frequency of said tuner means is shifted to the predetermined intermediate carrier frequency when the tuning voltage varies at a relatively quick rate for the AFT control; AFT counter means coupled to said digital-to-analog conversion means and adapted to count AFT clock pulse during the AFT control, variation in count number in said AFT counter means during the AFT control causing the analog tuning voltage from said digital-to-analog conversion means to vary at a rate depending on the frequency of AFT clock pulse applied to said AFT counter means, and said AFT counter means being responsive to said AFT circuit means to suspend to count the AFT clock pulse when said AFT circuit means detects that the output carrier frequency of said tuner means coincides with the predetermined intermediate carrier frequency; and AFT clock pulse frequency-changing means for lowering the frequency of AFT clock pulses supplied to said AFT counter means progressively at the respective intervals of the AFT control.

According to a first embodiment of this invention, the clock pulse frequency-changing means comprises frequency divider means for dividing the frequency of a clock pulse to produce a plurality of frequency-divided clock pulses having different frequencies; and circuit means for changing a frequency-divided clock pulse being supplied to the AFT counter means to another frequency-divided clock pulse having a lower frequency, each time the AFT circuit means detects the accurate tuning of the tuner to a received carrier frequency.

According to a second embodiment of the invention, the clock pulse frequency-changing means comprises frequency divider means for dividing the frequency of a clock pulse to produce a plurality of frequency-divided clock pulses having different frequencies; gate circuit means for selectively supplying frequency-divided clock pulses to the AFT counter means; and timer means for determining a timing in which a clock pulse being supplied to the AFT counter means is converted to another frequency-divided clock pulse having a lower frequency. The timer means is preferably so arranged as to be operated in response to commencement of the AFT control and detection by the AFT circuit of coincidence between the output carrier frequency of the tuner means and the predetermined intermediate carrier frequency.

The digital-analog conversion means is preferably comprised of circuit means for producing a pulse train whose pulse duration is a function of a digital signal read out of the memory means and a lowpass filter connected to said circuit means.

The invention can be more fully understood from the following detailed description when taken in conjunction with the accompanying drawings, in which.

Figure 12:
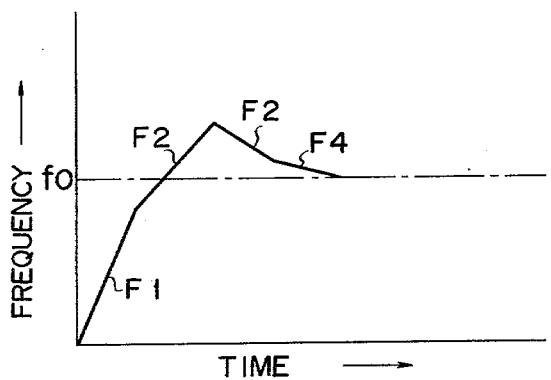

FIG. 11 indicates an arrangement of a clock changer according to a second embodiment of the invention;

FIG. 12 schematically shows the manner in which the AFT control is effected by the clock changer of FIG. 11; and FIG. 13 is a waveform diagram useful in explaining the operation of the clock changer of FIG. 11.

There will now be described by reference to FIG. 1 an electronic digital channel-selecting apparatus embodying this invention. This channel-selecting apparatus comprises a digital memory circuit 11 having a plurality of memory locations to store digital signals denoting a plurality of television channels. When one of channel-selecting keys provided at a channel-selecting circuit 12 is depressed, serial digital information representing the depressed key is delivered to a memory control circuit 13 which issues a parallel address signal to the memory circuit 11 to specify a memory location corresponding to the selected television channel.

During the read mode or television receiving mode, digital information on a television channel is read out of the memory circuit 11 in response to selection of the television channel and applied to a tuning pulse generator 14. This tuning pulse generator 14 produces a train of tuning pulses each having a predetermined period and a duration or duty factor which is a function of digital information under the control of clock pulse CK1 with a relatively high frequency from a clock pulse generator 15. The tuning pulse train is applied to a lowpass filter 17 through a matrix circuit 16 (acting as an amplifier until the AFT control is commenced). The lowpass filter 17 produces an analog tuning voltage VT having a magnitude proportional to the pulse duration of the tuning pulse train. The analog tuning voltage VT is impressed on voltage-controlled tuning elements such as varactors which are provided in an RF amplifier, local oscillator and mixer circuit of a tuner 18, which in turn is made to tune to the RF carrier frequency of the selected television channel. It is to be noted that, at this time, a band-switching voltage for selecting one of low- and high-band VHF channels and UHF channels is applied to tuned-circuits of the tuner 18 to switch inductances of the tuned circuits. The tuner 18 converts an incoming RF picture carrier frequency into an intermediate carrier frequency. The intermediate-frequency television signal is amplified by an intermediate-frequency amplifier 19 and then applied to a video detector (not shown).

Scores of milliseconds are required for an output voltage of the lowpass filter 17 to have a magnitude corresponding to digital information from the memory circuit 11 after a television channel is selected. The AFT control is carried out after an output voltage of the lowpass filter 17 has a magnitude corresponding to a selected television channel.

To this end, to the intermediate frequency amplifier 19 is connected a known AFT discriminator 20 having an S-shaped frequency-voltage response characteristic centered at a predetermined intermediate frequency of 45.75 MHz. An AFT detector 21 is connected to the AFT discriminator 20 to produce an output signal X, Y or Z, according as an intermediate picture carrier frequency obtained from the tuner 18 is lower, higher than or coincides with the predetermined intermediate carrier frequency.

An AFT pulse generator 22 is provided to produce an AFT pulse train having the same period as the tuning pulse train under the control of clock pulse CK1. The AFT pulse train is supplied to the matrix circuit 16. The pulse duration of the AFT pulse train varies depending on output states of the AFT detector 21. The matrix circuit 16 combines the tuning pulse train and AFT pulse train. The mode of combination (addition mode or subtraction mode) is set by a matrix control circuit 23 which is responsive to outputs X and Y of the AFT detector 21. During the AFT control, an output voltage of the lowpass filter 17 gradually increases or decreases, causing the tuner 18 to accurately tune to an incoming RF carrier frequency. When the tuner 17 accurately tunes with the RF carrier frequency, the intermediate carrier frequency of tuner 18 takes the predetermined value to cause the AFT detector 21 to issue a correct tuning detection signal Z (which is produced, each time coincidence occurs between an output carrier frequency of tuner 18 and the predetermined intermediate carrier frequency). As a result, the pulse duration of the AFT pulse train and the combination mode (addition or subtraction mode) of the matrix circuit 16 are fixed, causing the lowpass filter to continue generation of a tuning voltage having a constant magnitude.

During the AFT control, an output voltage of the lowpass filter 17 varies at a rate proportional to the frequency of AFT clock pulses supplied to the AFT pulse generator 22. The AFT discriminator 20 has an operation delay of about 10 milliseconds which is necessary to eliminate noises from AFT signals. The lowpass filter 17 also has an operation delay of about 30 to 40 milliseconds. When, therefore, the AFT clock pulse has a relatively high frequency, in other words, when an output voltage of the lowpass filter 17 varies at a relatively large rate, a timing in which the AFT detector 21 produces the output signal Z is delayed from a timing in which an output carrier frequency of the tuner 18 is shifted to the predetermined intermediate carrier frequency. Therefore, at a time that the AFT detector 21 produces the output signal Z, an output carrier frequency of the tuner 18 is shifted from the predetermined intermediate frequency. Consequently, readjustment of frequency is required. If a low frequency AFT clock pulse is used in consideration of the delayed operation of the AFT discriminator 20 and lowpass filter 17, then a relatively long time will be taken in the AFT control. The electronic digital channel-selecting apparatus embodying this invention comprises a clock changer 24 which gradually decreases the frequency of AFT clock pulses applied to the AFT pulse generator 22 through a plurality of intervals of the AFT control.

The AFT pulse generator 22 and clock changer 24 are connected to the channel-selecting circuit 12 and arranged to be reset to the initial condition the moment a certain length of time passes after selection of the television channel in which an output tuning voltage of the lowpass filter 17 may have a magnitude corresponding to digital information read out of the memory circuit 11. During this period, the matrix circuit 16 acts as an amplifier for the tuning pulse train.

During the write mode or tuning voltage-setting mode (program mode), digital information on a selected television channel is produced by the tuning pulse generator 14, and is stored in that memory location of the memory circuit 11 which corresponds to the selected television channel. During the write mode, the AFT pulse generator 22 and clock changer 24 remain inoperative, and the matrix circuit 16 acts as an amplifier for the tuning pulse train.

Figure 1:
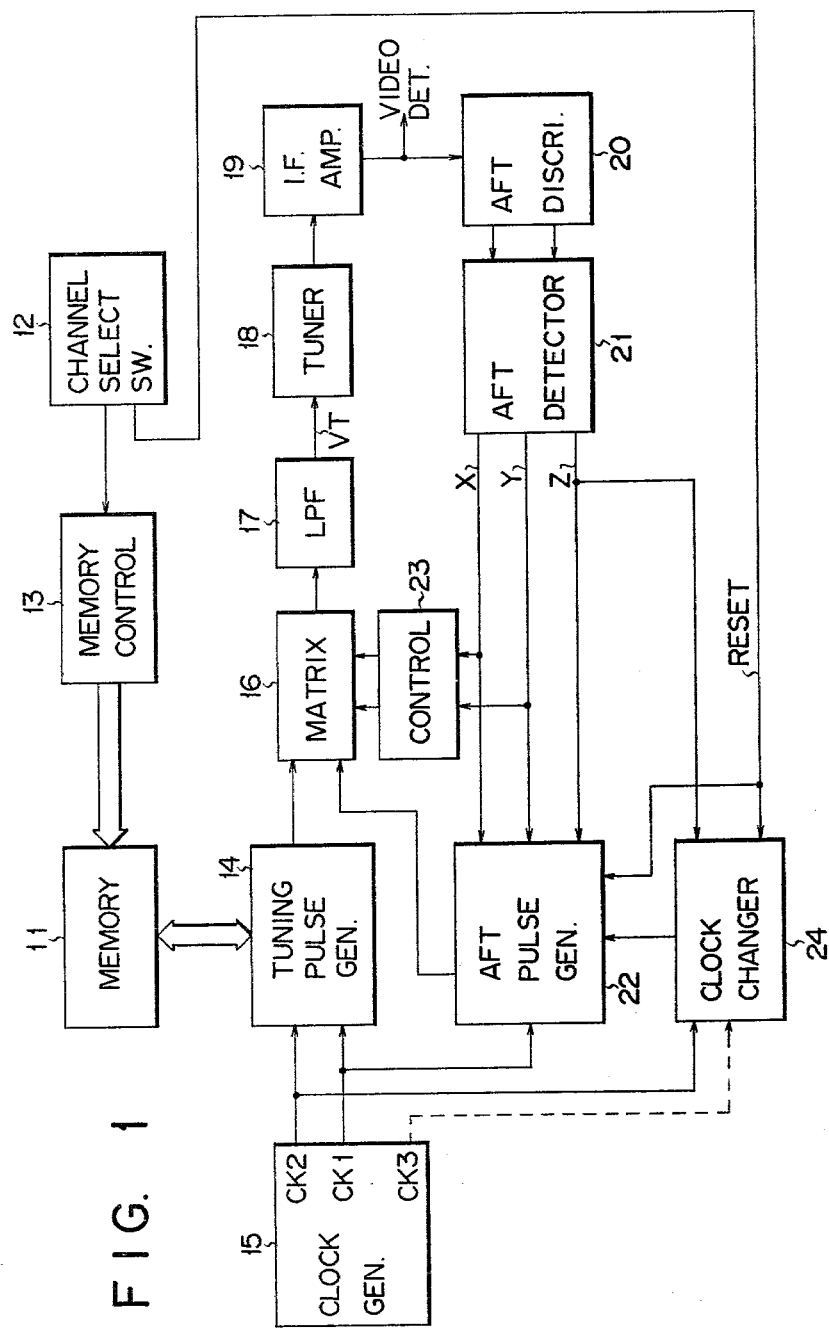
FIG. 1 is a schematic block diagram of an electronic digital channel-selecting apparatus embodying this invention.
Figure 2:
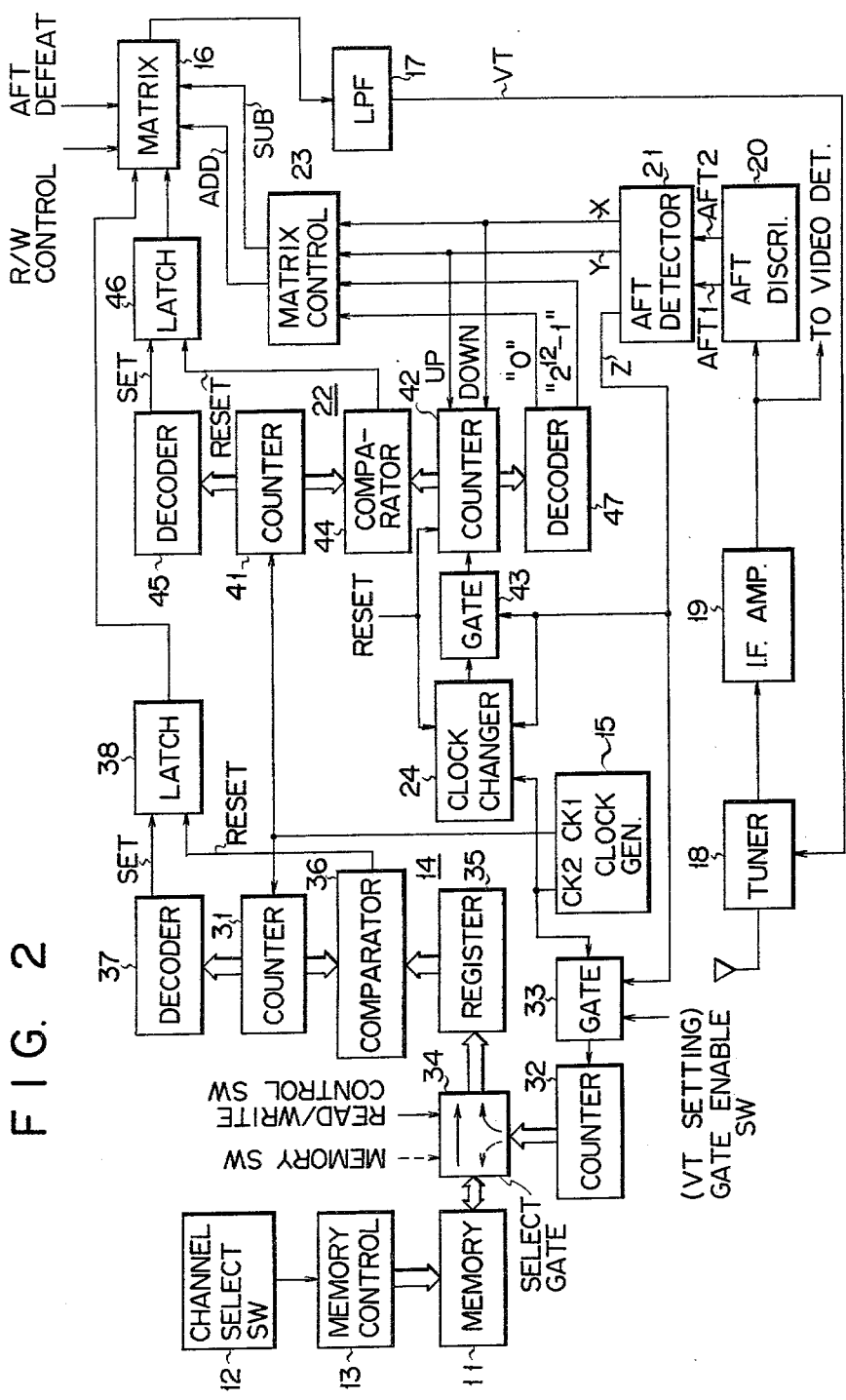
FIG. 2 is a block diagram showing in greater detail the tuning pulse generator and AFT pulse generator of FIG. 1 in particular.

FIG. 2 shows in greater detail the arrangements of the tuning pulse generator 14 and AFT pulse generator 22 of FIG. 1. The parts of FIG. 2 the same as those of FIG. 1 are denoted by the same numerals, description thereof being omitted.

The tuning pulse generator 14 is comprised of counters 31 and 32, gates 33 and 34, shift register 35, comparator 36, decoder 37 and latch circuit 38. The AFT pulse generator 22 is comprised of counters 41 and 42, gate 43, comparator 44, decoders 45 and 47 and latch circuit 46.

The counter 31 is supplied with the clock pulse CK1 from the clock pulse generator 15, and the counter 32 is supplied with a clock pulse CK2 through the gate 33. This gate 33 is disabled by the output signal Z of the AFT detector 21, and is enabled by a non-lock type gate-enabling switch used for the setting of a tuning voltage. The counters 31, 32 are of, for example, a 12-bit synchronous type, and initially reset when a power supply is turned on. The clock pulse CK1 has a frequency of, for example, about 2,048 MHz, and the clock pulse CK2 has a frequency of 512 Hz which is obtained by dividing the frequency of the clock pulse CK1 by a factor of 4096 ($=2^{12}$). Accordingly, each time the counter 31 counts clock pulses CK1 by 4096 (the full count number of counter 31), one clock pulse CK2 is applied to the counter 32.

A number counted by the counter 32 is loaded into the register 35 through the select gate 34 during the write mode which is set by a read/write control switch.

The decoder 37 is constituted by a NAND or NOR gate to detect a predetermined count number of the counter 31, for example, an initial count of zero. Each time the decoder 37 detects the initial count the latch circuit 38 is set to make its output high. The comparator 36 carries out comparison between a count number in the counter 32 loaded into the register 35 and a count number in the counter 31. When coincidence arises between both count numbers, the comparator 36 resets the latch circuit 38 to make its output low. A timing in which the comparator 36 resets the latch circuit 38 is shifted by one period of the clock pulse CK1, each time the counter 31 counts the clock pulses CK1 by the full count number. As a result, the latch circuit 38 produces a pulse train which has a fixed period equal to the full count time (1/512 sec) of the counter 31 and whose pulse duration varies in steps of the fixed period/4096 for each 1/512 sec. When supplied with a pulse train whose pulse duration is stepwise increased, the lowpass filter 17 generates an output tuning voltage which increases similarly stepwise. One step variation in the pulse duration of tuning pulse train from the latch circuit 38 gives rise to a change of, for example, 8 millivolts in the tuning voltage. The 8 millivolt-change in the tuning voltage varies the local oscillator frequency of the tuner 18 by 10 KHz at a low channel band.

When the tuner 18 is made to accurately tune to a particular television channel by the variation of the tuning voltage, the AFT detector 21 produces the gate-disabling signal Z to disable the gate 33. As a result, clock pulses CK2 are prevented from being supplied to the counter 32, thereby fixing a count number in the counter 32. This fixed count number in the counter 32 leads to the fixation of the pulse duration of output tuning pulse train from the latch circuit 38 and an output tuning voltage VT of the lowpass filter 17. The fixed count number in the counter 32 is stored through the gate 34 in that memory location of the memory circuit 11 which corresponds to the selected television channel by operation of a memory switch. The setting of a tuning voltage VT for any other selected television channel is carried out by enabling the gate 33 through operation of the gate-enabling switch. With the other television channels, counts made by the counter 32 are stored in the corresponding memory locations of the memory circuit 11.

During the read mode, the select gate 34 is changed over to feed digital information stored in the memory circuit 11 to the register 35. During the read mode, the pulse duration of a tuning pulse train from the latch circuit 38 is fixed and constitutes a function of digital information read out of the memory circuit 11.

The AFT pulse generator 22 remains inoperative during the write mode, and is operated only during the read mode. The counter 41 may be of the 12-bit synchronous type and counts clock pulses CK1 from the clock pulse generator 15 in synchronism with the counter 31. The initial count zero of the counter 41 is detected by the decoder 45 formed of a NAND or NOR gate. Each time the initial count zero of the counter 41 is detected, the decoder 45 sets the latch circuit 46 to make its output high. The clock pulse CK2 is applied to the clock changer 24 where it is frequency-divided.

Frequency-divided clock pulses are selectively supplied to the AFT counter 42 through the gate 43 over the intervals of the AFT control. The counter 42 is of a 12-bit synchronous up/down type, and is reset to an initial count by a reset signal at the beginning of the AFT control. The clock changer 24 is also reset to an initial state by the reset signal. Comparison is made between count numbers in the counters 41 and 42 by the comparator 44 and when coincidence takes place the rebetween, the latch circuit 46 is reset to make its output low. The latch circuit 46 produces the AFT pulse train having the same period as the tuning pulse train from the latch circuit 38. The rising edge of the AFT pulse coincides with that of the tuning pulse, and the duration of AFT pulse varies during the AFT control with a count number in the AFT counter 42. This AFT counter 42 operates as a down counter when the AFT detector 21 produces the output signal X showing that an output carrier frequency of the tuner 18 is too low and acts as an up counter when the AFT detector produces the output signal Y showing that an output carrier frequency of the tuner 18 is too high. A decoder 47 is provided to detect the initial count value "0" and full count value "$2^{12}-1$" of the AFT counter 42.

The matrix control circuit 23 is responsive to the outputs X and Y of the AFT detector 21 and the outputs of decoder 47 to cause the matrix circuit 16 to act as an adder when the output X of AFT detector 21 is high at the beginning of the AFT control, and to act as a subtractor when the output Y of AFT detector 21 is high at the beginning of the AFT control. The matrix circuit 16 is arranged to combine the tuning pulse and AFT pulse in a predetermined amplitude ratio of, for example, 2:1. Accordingly, one-step variation in the duration of AFT pulse caused by variation of "1" in a count number of the AFT counter 42 leads to a change of about 4 millivolts in the tuning voltage VT. This change of about 4 millivolts shifts a local oscillation frequency by about 5 KHz at the low channel band, for example.

Figure 3:
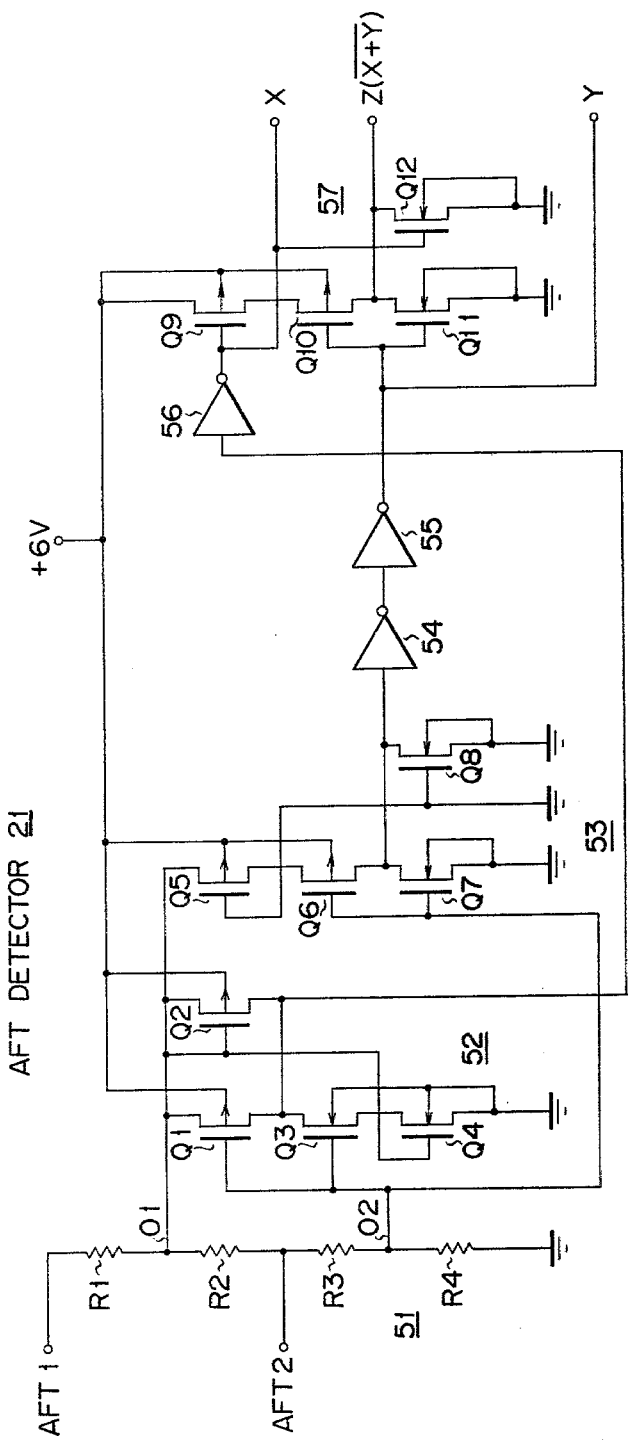
FIG. 3 shows a circuit arrangement of the AFT detector of FIG. 1.
Figure 4A:
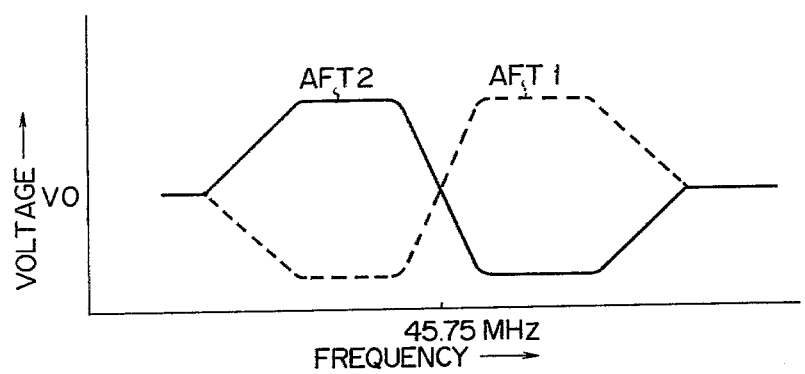
FIGS. 4A to 4C are diagrams useful in explaining the operation of the AFT detector of FIG. 3.

The AFT detector 21 may be formed, as shown in FIG. 3, of a voltage divider circuit 51, NAND circuit 52, NOR circuit 53, inverters 54, 55, 56 and NOR circuit 57. The voltage divider 51 is comprised of resistors R1 to R4 having the same resistance. A first AFT signal AFT1 (FIG. 4A) issued from the AFT discriminator 20 is supplied to one end of the voltage divider 51, the other end of which is grounded. A second AFT signal AFT2 (FIG. 4A) is supplied to the intermediate point of the voltage divider 51, that is, the junction of the resistors R2, R3. As seen from FIG. 4A, the first and second AFT signals have the opposite polarities with respect to a referential voltage level VO of about 6 volts.

The NAND circuit 52 comprises parallel-connected P-channel MOS transistors Q1, Q2 and series-connected N-channel MOS transistors Q3, Q4. The source electrodes of transistors Q1, Q2 are connected to the first voltage divider output O1 or the junction between the resistor R1 and R2 (a voltage at this junction indicates 6 volts, an average of the AFT signals AFT1 and AFT2). The second divider output 02 or the junction between the resistor R3 and R4 (half the voltage of the second AFT signal AFT2 is taken from this junction) is connected to the gate electrodes of transistors Q1, Q3. The first divider output 01 is connected to the gate electrodes of transistors Q2, Q4. With the configuration of the NAND circuit 52 as shown, the transistor Q2 is normally rendered nonconducting, while the transistor Q4 is normally rendered conducting.

The NOR circuit 53 is formed of series-connected P-channel MOS transistors Q5, Q6 and parallel-connected N-channel MOS transistors Q7, Q8. The source of transistor Q5 is connected to the first output O1 of the voltage divider 51. The gates of transistors Q6, Q7 are connected to the second output O2 of the voltage divider 51. The gates of transistors Q5, Q8 are grounded. With the NOR circuit 53 as shown, the transistor Q5 is normally rendered conducting, while the transistor Q8 is normally rendered nonconducting.

The NOR circuit 57 is comprised of series-connected P-channel transistors Q9, Q10 and parallel-connected N-channel transistors Q11, Q12. The gates of transistors Q9, Q12 are connected to the output of the NAND circuit 52 through the C MOS inverter 56. The gates of transistors Q10, Q11 are connected to the NOR circuit 53 with C MOS inverters 54, 55 interposed therebetween. The output X of AFT detector 21 is connected to the output of inverter 56. The output Y of AFT detector 21 is connected to the output of inverter 55. The output Z of AFT detector 21 is connected to the junction of the drains of transistors Q10, Q11 and to the drain of transistor Q12.

In operation of the AFT detector 21 the transistor Q4 of the NAND circuit 52 is normally rendered conducting as described above. Therefore, the source-to-substrate voltage of transistor Q3 is raised by the saturated voltage across the source-drain path of transistor Q4. As a result, the threshold voltage of an inverter constituted by the transistors Q1, Q3 is raised. Where, therefore, a voltage (half the voltage of the second AFT signal AFT2) at the second output O2 of the voltage divider 51 exceeds a voltage level V1 which is higher than ½ VO, then an output voltage of the NAND circuit 52 goes low. When, therefore, an output carrier frequency of the tuner 18 is unduly lower than the predetermined intermediate carrier frequency of 45.75 MHz, the output X goes high as shown in FIG. 4C.

Figure 4B:
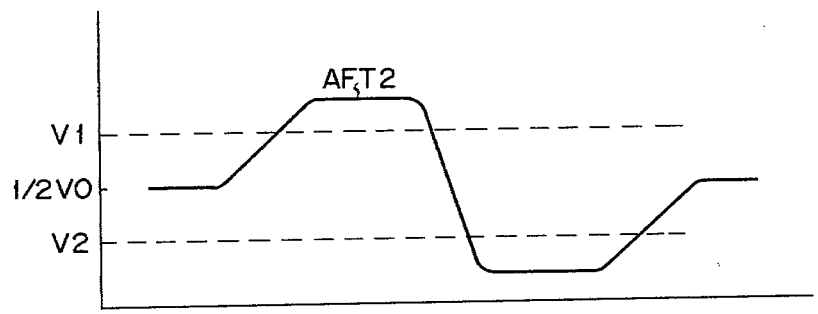

With the NOR circuit 53, on the other hand, since the transistor Q5 is normally rendered conducting as described above, the threshold voltage of an inverter constituted by the transistors Q6, Q7 (which switches the output of the NOR circuit from a low to a high level) falls below ½ VO. When, therefore, as shown in FIG. 4B, an output voltage at the second output O2 of the voltage divider 51 falls below a voltage level V2 which is lower than ½ VO, the output Y is switched, as shown in FIG. 4C, from a low to a high level, indicating that an output carrier frequency of the tuner 18 is unduly higher than 45.75 MHz.

Figure 4C:
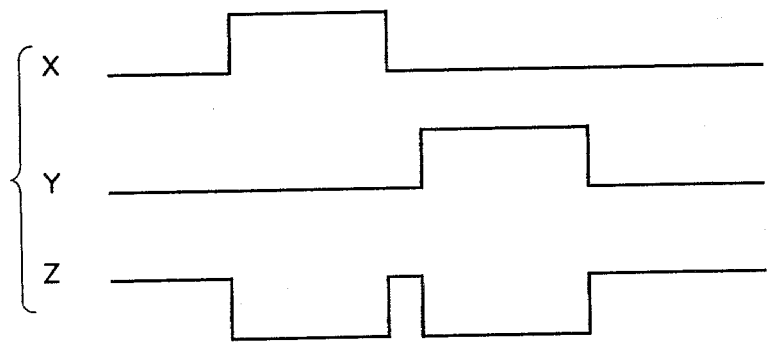

When an output voltage at the second output O2 of the voltage divider 51 lies between the voltage levels V1 and V2, in other words, when an output carrier frequency of the tuner 18 is substantially equal to 45.75 MHz within an allowable range, the output Z goes high as shown in FIG. 4C. It may be arranged so that the output Z goes high when an output carrier frequency of the tuner 18 is close to 45.75 MHz within the range of, for example, ±20 KHz.

Figure 5:
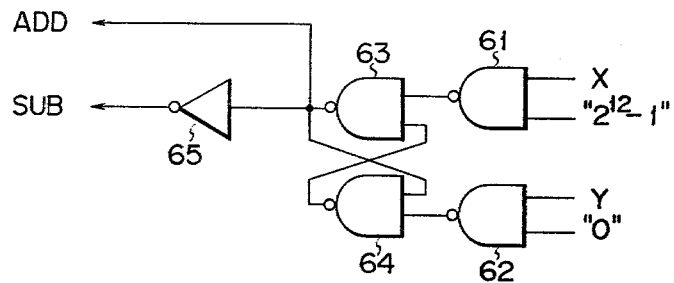
FIG. 5 illustrates an arrangement of the matrix control circuit of FIG. 1.

The matrix control circuit 23 may be arranged as shown, for example, in FIG. 5. The inputs of a NAND gate 61 are respectively coupled with the output X of the AFT detector 21 and the "$2^{12}-1$" output of the decoder 47, while the inputs of a NAND gate 62 are respectively coupled with the output Y of the AFT detector 21 and the "0" output of the decoder 47. The outputs of NAND gates 61, 62 are connected to the corresponding inputs of cross-coupled NAND gates 63, 64. The output of the NAND gate 63 is connected to an inverter 65.

When, at the beginning of the AFT control, an output carrier frequency of the tuner 18 is unduly lower than 45.75 MHz, in other words, when the output X of the AFT detector 21 is high the AFT counter 42 acts as a down counter as previously described. When, therefore, the AFT counter 42 is counted from "0" to down "$2^{12}-1$", the the output of the NAND gate 61 goes low, causing the output of NAND gate 63 to go high. As a result, the ADD output of the matrix control circuit 23 goes high and the SUB output goes low, causing the matrix circuit 16 to act as an adder. Accordingly, a tuning voltage VT gradually increases, causing the local oscillator frequency and the output carrier frequency of the tuner 18 to go higher. When, at the beginning of the AFT control, an output carrier frequency of the tuner 18 is excessively higher than 45.75 MHz, in other words, where the output Y of the AFT decoder 21 is high, the AFT counter 42 acts as an up counter as previously mentioned. As a result, the output of the NAND gate 62 goes low at the beginning of the AFT control, thereby causing the output of NAND gate 63 to go low. As a result, the ADD and SUB outputs of the matrix control circuit 23 go low and high, respectively, causing the matrix circuit 16 to act as a subtracter. Accordingly, the tuning voltage VT gradually decreases, and the output carrier frequency of the tuner 17 gradually gets lower.

Figure 6:
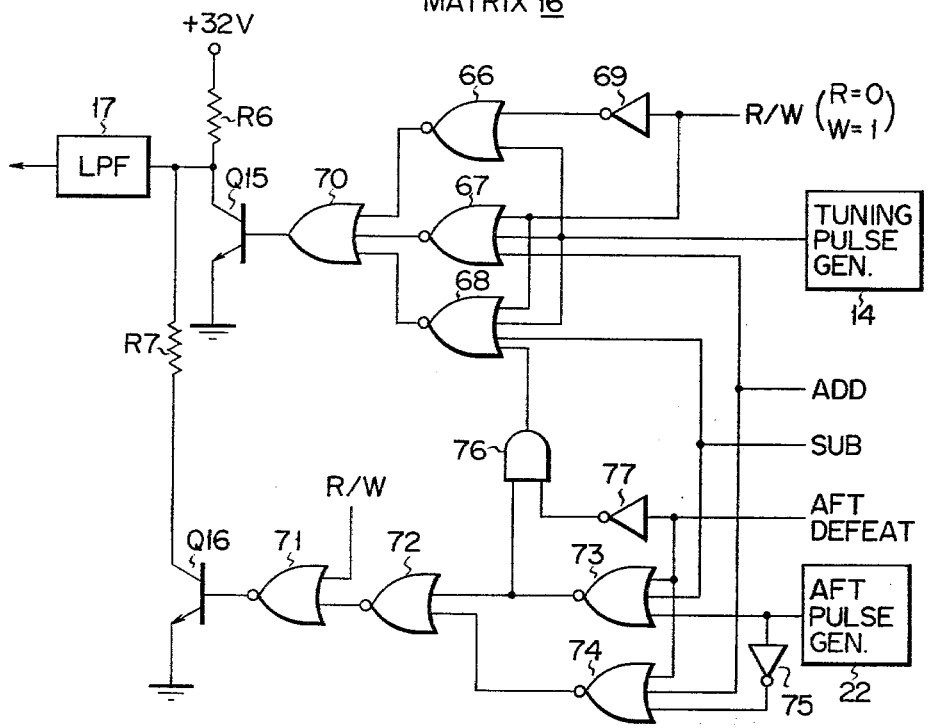
FIG. 6 illustrates an arrangement of the matrix circuit of FIG. 1.

There will now be described by reference to FIG. 6 the arrangement and operation of the matrix circuit 16. This matrix circuit 16 includes NPN switching transistors Q15, Q16. The transistor Q15 has its emitter grounded and its collector connected to the input of the lowpass filter 17 and a power source of 32 volts through a resistor R6, while the transistor Q16 has its emitter grounded and its collector connected to the collector of transistor Q15 through a resistor Q7. The resistor R7 has the same resistance as the resistor R6. As a result, an input signal to the base of transistor Q15 and an input signal to the base of transistor Q16 are combined in the ratio of 2:1.

During the write mode, a R/W control signal has a logic level of 1, causing NOR gates 67, 68, 71 to be disabled. However, a NOR gate 66 is enabled by an inverter 69 which inverts the R/W control signal. While the NOR gate 71 is disabled, the transistor Q16 remains nonconducting. Therefore, the tuning pulse generator 14 is coupled to the base of transistor Q15 through NOR gate 66 and OR gate 70, and thus the tuning pulse train appears at the collector of transistor Q15. During the write mode, therefore, the matrix circuit 16 only acts as an amplifier for the tuning pulse train. During the read mode, the NOR gate 71 is enabled, but the NOR gate 66 is disabled. During the read mode, the AFT operation is defeated until the tuning voltage VT produced by the tuning pulse train from the tuning pulse generator 14 is stabilized after selection or changeover of a television channel.

While the AFT operation is defeated, a AFT defeat signal having a logic level of 1 is supplied to NOR gates 73, 74 to disable them. As a result, the AFT pulse generator 22 is prevented from being coupled to the base of transistor Q16. The AFT defeat signal is supplied to an AND gate 76 through an inverter 77, causing the output of AND gate 76 to go low. During the AFT defeat, the tuning pulse generator 14 is coupled to the transistor Q15 through the NOR gate 67 or 68 depending on the output stage of matrix control circuit 23. The AFT defeat is released after about 100 milliseconds from selection of a television channel. The AFT counter 42 in the AFT pulse generator 22 is reset to the initial value upon release of the AFT defeat.

Figure 7:
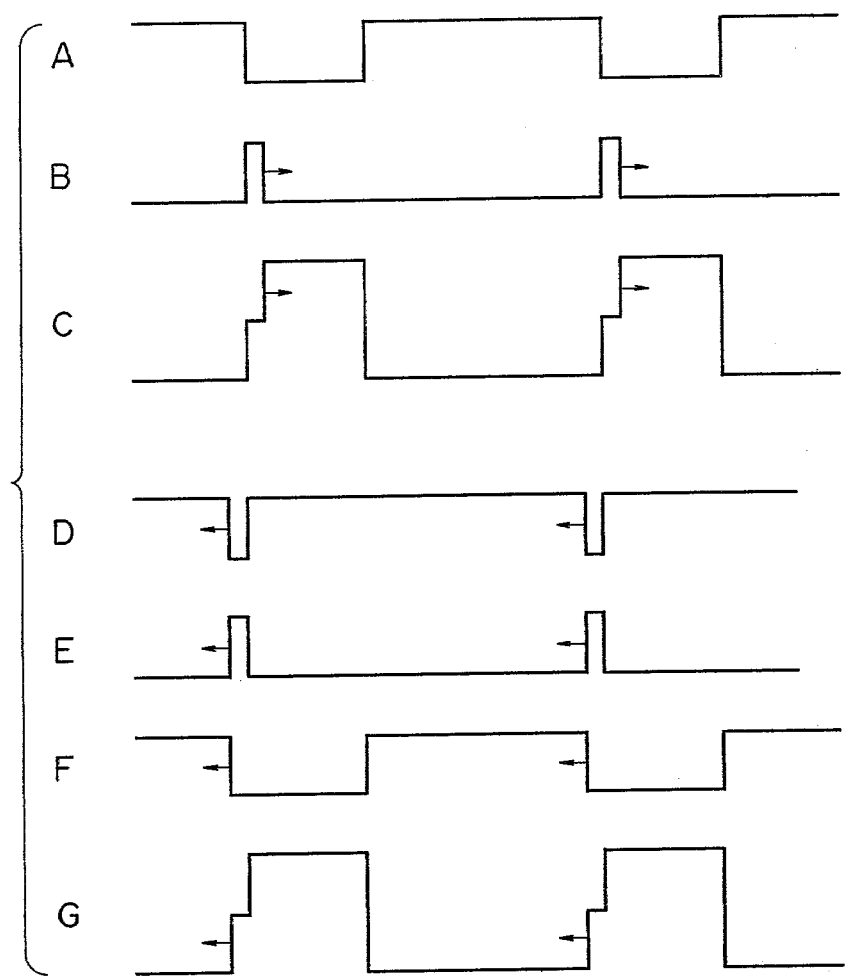
FIG. 7 is a waveform diagram useful in explaining the operation of the matrix circuit of FIG. 6.

At the beginning of the AFT control, the logic level of outputs ADD and SUB of the matrix control circuit 23 are specified as previously mentioned. Now let it be assumed that the ADD output is 0, and the SUB output is 1. Since, under this condition, the output Y of the AFT detector 21 is high (logic 1), the AFT counter 42 is in the up-count mode. Since the output SUB is high, the NOR gates 68, 73 are disabled. As a result, the AFT pulse generator 22 is coupled to the base of transistor Q16 through an inverter 75, and NOR gates 74, 72, 71 in turn. The tuning pulse generator 14 is coupled to the base of transistor Q15 through the NOR gate 67 and OR gate 70. What is to be noted in this case is that an input waveform at the base of transistor Q15 is opposite in polarity to an output waveform of the tuning pulse generator 14, and a base input waveform of the transistor Q16 has the same polarity as an output waveform from the AFT pulse generator 22. FIG. 7A shows the base input waveform of the transistor Q15, and FIG. 7B indicates the base input waveform of the transistor Q16. It will be understood that since the voltage gain of the transistor Q16 is half that of the transistor Q15 such an output waveform as shown in FIG. 7C will appear at the collector of transistor Q15. Since the AFT counter 42 is in the up-count mode, the duration of base input pulse of the transistor Q16 shown in FIG. 7B increases with time, causing the upper half of the collector output pulse of the transistor Q15 shown in FIG. 7C to decrease with time, and consequently the magnitude of output voltage VT of the lowpass filter 17 and a local oscillator frequency to fall. As will be evident from the output waveform shown in FIG. 7C, under the output state of matrix control circuit in which ADD=0, SUB=1, the matrix circuit 16 operates in the subtraction mode.

Conversely when ADD=1 and SUB=0, the AFT counter 42 is in the down-count mode since the output X of AFT detector 21 is high. Since ADD=1 the NOR gates 67, 74 are disabled. FIG. 7D shows the output waveform of the AFT pulse generator 22 whose AFT counter 42 is in the down-count mode and the output waveform of FIG. 7D is coupled to the base of transistor Q16 through the NOR gates 73, 72, 71. Consequently, the base input waveform of transistor Q16 is, as seen from FIG. 7E, opposite in polarity to the output waveform of the AFT pulse generator 22. An output signal of the NOR gate 73 is coupled to one of inputs of the NOR gate 68 through the AND gate 76. The other input terminal of the NOR gate 68 is coupled with an output signal of the tuning pulse generator 14. Therefore, such waveform as shown in FIG. 7F appears at the output of NOR gate 68 or the base of transistor Q15. A period corresponding to the low level portion of the waveform of FIG. 7F is made longer than a period corresponding to the low level portion of the waveform of FIG. 7A which appears when the tuning pulse generator 14 alone is coupled to the base of transistor Q15.

Due to the base input waveform of transistor Q16 shown in FIG. 7E and the base input waveform of transistor Q15 shown in FIG. 7F, such a waveform as shown in FIG. 7G will appear at the collector of transistor Q15. Since the AFT counter 42 is in the down-count mode the width of the lower portion of the output waveform of the transistor Q15 is extended with time, as seen from FIG. 7F, causing a local oscillator frequency to go higher. It will be evident that, when ADD=1 and SUB=0, the matrix circuit 16 operates in the addition mode.

Figure 9:
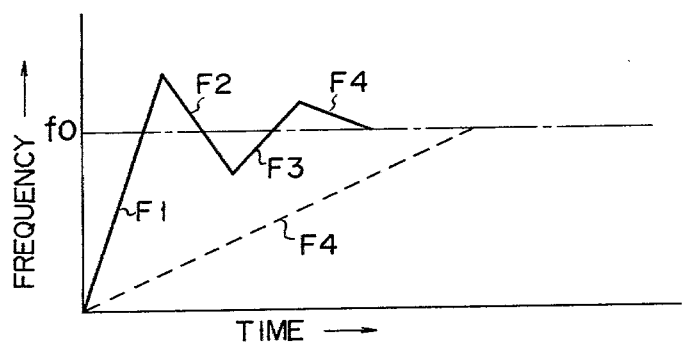
FIG. 9 illustrates the AFT control operation effected by the clock changer of FIG. 8.
Figure 8:
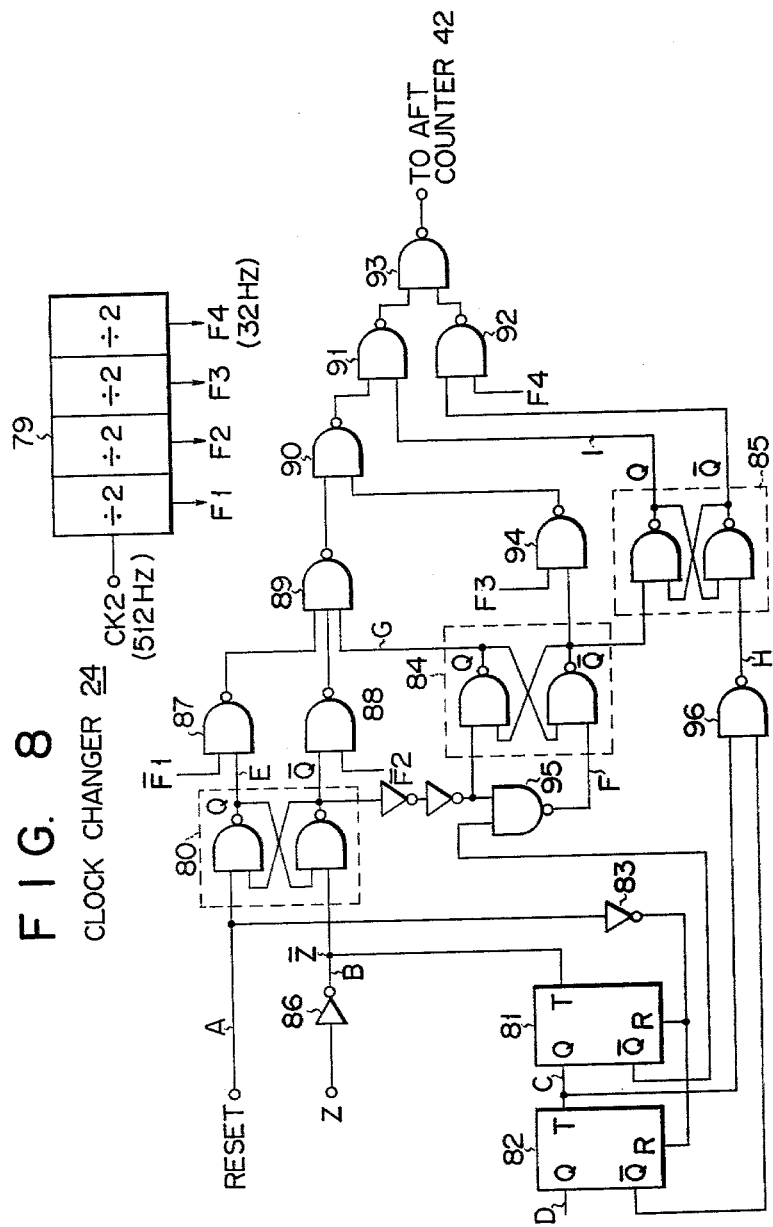
FIG. 8 shows an arrangement of the clock changer of FIG. 1 according to a first embodiment of this invention.
Figure 10:
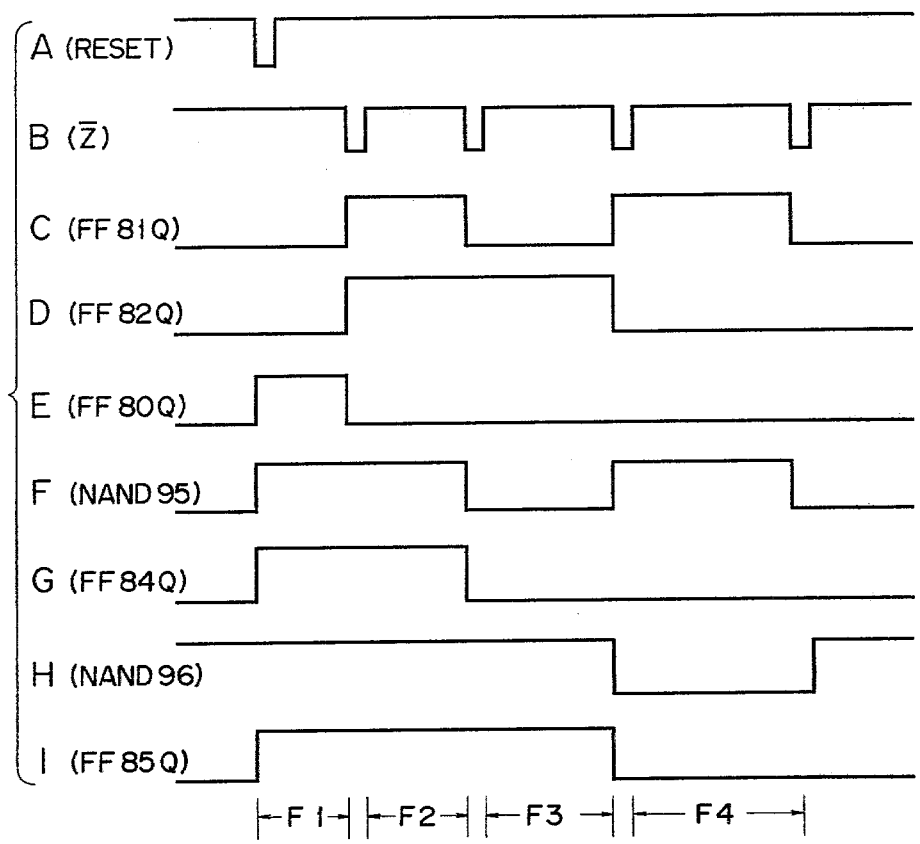
FIG. 10 is a waveform diagram useful in explaining the operation of the clock changer of FIG. 8.

There will now be described by reference to FIGS. 8 to 10 the arrangement and operation of the clock changer 24 according to one embodiment of this invention. The clock pulse CK2 (having a frequency of 512 Hz) from the clock pulse generator 15 is supplied to an asynchronous counter or frequency divider chain 79 consisting of cascade-connected binary counters to produce frequency-divided clock pulses F1 (256 Hz), F2 (128 Hz), F3 (64 Hz) and F4 (32 Hz). When the AFT defeat is released, the channel select circuit 12 supplies a reset pulse or AFT control initiating pulse as shown in FIG. 10A to a flip-flop circuit 80 consisting of cross-coupled NAND gates and of reset terminals of flip-flop circuits 81, 82 through an inverter 83. By application of the reset pulse, the outputs Q of the flip-flop circuits 80, 84, 85 and the output of a NAND gate 95 are made high as shown in FIG. 10. As a result, NAND gates 88, 92, 94 are disabled, while NAND gates 87, 89, 90, 91, 93 are enabled. Since, the NAND gate 87 is supplied with a pulse F1 complementary to the clock pulse $\overline{F1}$, the AFT counter 42 receives the clock pulse F1. When, at the beginning of the AFT control, the output carrier frequency of the tuner 18 is unduly lower than 45.75 MHz, the AFT counter 42 is in the down-count mode, and the matrix circuit 16 is in the addition mode. Consequently, the tuning voltage VT increases with time at a rate proportional to the frequency of the clock pulse F1, causing a local oscillator frequency to go higher with time as illustrated in FIG. 9. After the local oscillator frequency reaches a level fo adapted to produce the correct intermediate carrier frequency, the AFT detector 21 produces an output signal Z. When the output signal Z is produced, the output carrier frequency of the tuner 17 will have actually become unduly higher than 45.75 MHz, causing the output Y of the AFT detector 21 to go high soon. Therefore, the AFT counter 42 is switched from the down-count mode to the up-count mode.

The output signal Z is applied to the flip-flop circuits 80 and 81 through an inverter 86 causing the output Q of the flip-flop circuit 80 to go low, and the outputs Q of the flip-flop circuits 81, 82 to go high. The first application of output signal Z disables the NAND gate 87 and enables the NAND gate 88. Since the flip-flop circuit 84, 85 do not change the output state, the NAND gates 89, 90, 91, 93 remain enabled, and the NAND gates 92, 94 remain disabled. Accordingly, the clock pulse F2 is applied to the AFT counter 42. During this interval the matrix circuit 16 is in the addition mode and AFT counter 42 is in the up-count mode. Therefore, the width of the lower portion of the output waveform of the matrix circuit 16 shown in FIG. 7G decreases with time causing the tuning voltage VT to get lower with time and the local oscillator frequency to be lowered with time as illustrated in FIG. 9. The correction speed of the tuning voltage VT depends on the frequency of clock pulse F2. Since, in this case, the clock pulse F2 has a relatively high frequency, the AFT detector 21 produces the output signal Z which causes the output Q of flip-flop circuit 81 to go low at a time when the local oscillator frequency falls below fo. Later the output X of the AFT detector 21 goes high so that the AFT counter 42 is switched to down-count mode.

Since the Q of the flip-flop circuit 81 is made to go low, the output of the NAND gate 95 goes low, as shown in FIG. 10F, changing the output state of flip-flop circuit 84. As a result, the NAND gate 89 is disabled, and the NAND gate 94 is enabled. Since no change occurs in the output state of the flip-flop circuit 85, the NAND gate 91 remains enabled, and the NAND gate 92 remains disabled. Consequently, the clock pulse F3 is applied to the AFT counter 42. Since, during this interval, the AFT counter 42 is in the down-count mode, the width of the lower portion of the output waveform (FIG. 7G) of the matrix circuit 16, and consequently the tuning voltage VT increase with time. Since the clock pulse F3 still has a high frequency, the output Z of the AFT detector 21 is made to go high when the local oscillator frequency becomes higher than fo. As shown in FIG. 10, therefore, the output Q of the flip-flop circuit 81 goes high, and the output Q of the flip-flop circuit 82 goes low. At this time, the output Q of the NAND gate 96 goes low to change the output state of the flipflop circuit 85. Thus, the NAND gate 91 is disabled, and the NAND gate 92 is enabled, feeding the clock pulse F4 of the lowest frequency to the AFT counter 42. Since, at the beginning of this interval, the output carrier frequency of the tuner 18 is higher than 45.75 MHz, the output Y of the AFT detector 21 is high. The AFT counter 42 is, therefore, changed into the up-count mode so that the width of the lower portion of the output waveform of the matrix circuit 16 is reduced with time, causing the tuning voltage VT to fall similarly with time. Since the frequency of the clock pulse F4 is low enough, the output Z of the AFT detector 21 may go high the instant the local oscillator frequency reaches fo. As a result, the AFT clock pulse is prevented from being supplied to the AFT counter 42. Any subsequent AFT control, if required, is effected by the clock pulse F4 alone.

With the clock changer 24 particularly provided according to this invention, the frequency of AFT clock pulses supplied to the AFT counter 42 gets lower progressively at the respective intervals of the AFT control. As illustrated in FIG. 9, therefore, the AFT control can be completed in a shorter time than when the clock pulse F4 alone is applied.

There will now be described by reference to FIGS. 11 to 13 the arrangement and operation of a clock changer according to a second embodiment of this invention. This second embodiment comprises a timer circuit for determining a timing in which the frequency of a clock pulse applied to the AFT counter 42 is to be changed. Therefore, an amount of the overshoot or undershoot of a local oscillator frequency with respect to a predetermined level of the frequency is effectively reduced, making it possible to complete the AFT control in a shorter time than has been possible with a clock changer according to the first embodiment of the invention.

In FIG. 11, reference numeral 101 denotes a frequency divider chain for dividing the frequency of clock pulse CK2 into AFT clock pulses F1 (256 Hz), F2 (128 Hz), and F4 (32 Hz). The timer circuit is mainly comprised of flip-flop circuits 105, 106. A clock pulse CK3 (FIG. 13E) having a frequency of, for example, 128 Hz undergoes ½ frequency division in a flip-flop circuit 107. An output signal of this flip-flop circuit 107 is supplied to the flip-flop circuit 105 when a NAND circuit 111 is enabled. A reset pulse or AFT control start pulse (FIG. 13A) is supplied to the reset terminals of flip-flop circuits 105, 106, 108, causing the outputs Q thereof to go low and the outputs $\overline{Q}$ thereof to go high. The reset pulse is also supplied to NOR gate 109 to cause the output thereof to go low, as indicated in FIG. 13C. As a result the output Q of the flip-flop circuit 102 goes high as illustrated in FIG. 13D to enable the NAND gate 111. Consequently, the flip-flop circuits 105, 106 begin to count output pulses (FIG. 13F) of the NAND gate 111.

The reset pulse is further conducted to the flip-flop circuit 103 through an inverter 119 to cause the output Q to go high and the output $\overline{Q}$ to go low. Therefore, a NAND gate 113 to which clock $\overline{F1}$ is applied is enabled, while a NAND gate 114 to which clock F2 is applied is disabled so that its output goes high. By the low output $\overline{Q}$ of flip-flop circuit 103 the output Q of the flip-flop circuit 104 is rendered high, while the output $\overline{Q}$ thereof is rendered low, causing the NAND gate 116 to be disabled. Therefore, the output of the NAND gate 116 remains high. Since, at this time, NAND gates 115, 117 are enabled, the clock pulse F1 issued from the NAND gate 113 is applied to the AFT counter 42 through the NAND gates 115, 117. Consequently, the local oscillator frequency is corrected at a rate corresponding to the frequency of clock pulse F1 (FIG. 12).

The output of the NAND gate 111, the output $\overline{Q}$ of the flip-flop circuit 105, the output Q of the flip-flop circuit 106 and the output $\overline{Q}$ of the flip-flop circuit 102 are all coupled to inputs of a NOR gate 112. Since the output $\overline{Q}$ of the flip-flop circuit 102 remains low, when the output of the NAND gate 111, the output $\overline{Q}$ of the flip-flop circuit 105 and the output Q of the flip-flop circuit 106 all go low, the output of the NOR gate 112 goes high, as shown in FIG. 13I. The output of the NOR gate 112 is coupled to an input of a NAND gate 110, the other input of which is coupled with the clock pulse CK3 through an inverter 120. The instant, therefore, the output of the NOR gate 112 goes high and the clock pulse CK3 goes low, the output of the NAND gate 110 goes low. This changes the output state of the flip-flop circuit 102 so that the output $\overline{Q}$ goes high and the output Q goes low. Accordingly, the output of NOR gate 112 goes low to cause the output of NAND gate 110 to go high at once as shown in FIG. 13J.

The above-mentioned change in the output state of flip-flop circuit 102 gives rise to a change in the output state of the flip-flop circuit 103 so that the NAND gate 113 is disabled, while the NAND gate 114 is enabled. Since the change in the output state of the flip-flop circuit 103 does not lead to a change in the output state of the flip-flop circuit 104, the NAND gate 115 remains enabled. Accordingly, the clock pulse F2 is supplied to the AFT counter 42 through the NAND gates 115, 117. Thus, the local oscillation frequency is corrected at lower rate than when the clock pulse F1 is applied. Since, at this time, the output Q of the flip-flop circuit 102 remains low, the timer circuit does not count clock pulses CK3.

After the local oscillator frequency reaches fo corresponding to a selected television channel during the interval of AFT control using the clock pulse F2, the AFT control-suspending signal Z (FIG. 13B) is delivered to the NOR gate 109. Consequently, the output Q of the flip-flop circuit 102 is rendered high, putting the timer circuit again into operation.

Since the output $\overline{Q}$ of flip-flop circuit 103 remains high when all the inputs of NOR gate 112 are low, the output of AND gate 118 goes high as shown in FIG. 13L, causing the output $\overline{Q}$ of flip-flop circuit 108 to go low. This changes the output state of flipflop circuit 104 such that the output $\overline{Q}$ thereof goes high. As a result, the NAND gate 115 is disabled, and the clock pulse F4 is applied to the AFT counter 42 through the NAND gates 116, 117. Since, as previously described, the clock pulse F4 has a sufficiently low frequency, coincidence arises between a timing in which the local oscillator frequency reaches fo and a timing in which the AFT control-suspending signal Z is issued. Thus, the AFT control is brought to an end.

According to the above-mentioned embodiments, in order to convert digital information into analog voltage, the digital information is convented into a pulse train having a duty factor which is a function of the digital information and then the pulse train is converted into an analog voltage through a lowpass filter. Instead, it is possible to use a digital-analog converter designed to directly convert a digital signal into an analog signal.

What is claimed is:

1. An electronic digital channel-selecting apparatus comprising:

memory means for storing digital signals corresponding to a plurality of channels of which a digital signal representing a selected channel is read out in response to selection of the channel;

digital to analog conversion means coupled to said memory means for converting the digital signal read out of said memory means into an analog turning voltage;

voltage-controlled tuner means coupled to said digital to analog conversion means for converting a received carrier frequency on the selected channel into a predetermined intermediate carrier frequency, said voltage-controlled tuner means being responsive to tuning voltages of different magnitudes to tune to different carrier frequencies on different channels and controllable to correctly tune to the carrier frequency on a selected channel within a given range by a tuning voltage the magnitude of which varies during an automatic fine tuning (AFT) control;

AFT circuit means coupled to said voltage-controlled tuner means for producing a control signal when an output carrier frequency of said tuner means substantially coincides with the predetermined intermediate carrier frequency;

clock means for producing AFT clock pulses at each of a plurality of frequencies;

wherein said clock means comprises frequency-dividing means for dividing the frequency of clock pulses to produce a plurality of frequency-divided AFT clock pulses having different frequencies;

AFT counter means connected to said clock means for counting AFT clock pulses during said fine tuning control;

means for suspending counting of said AFT counter means in response to said control signal;

means connected to said counter means and said digital-to-analog conversion means for causing the analog tuning voltage to vary at a rate depending upon the frequency of AFT clock pulses counted; and means connected to said clock means and counter means for switching the AFT clock pulses to a lower frequency during said fine tuning control; wherein said switching means comprises circuit means responsive to application of said control signal from said AFT circuit means to switch a frequency-divided AFT clock pulse being applied to said AFT counter means to another clock pulse having a lower frequency.

2. An electronic digital channel-selecting apparatus comprising:

memory means for storing digital signals corresponding to a plurality of channels of which a digital signal representing a selected channel is read out in response to selection of the channel;

digital to analog conversion means coupled to said memory means for converting the digital signal read out of said memory means into an analog turning voltage;

voltage-controlled tuner means coupled to said digital to analog conversion means for converting a received carrier frequency on the selected channel into a predetermined intermediate carrier frequency, said voltage-controlled tuner means being responsive to tuning voltages of different magnitudes to tune to different carrier frequencies on different channels and controllable to correctly tune to the carrier frequency on a selected channel within a given range by a tuning voltage the magnitude of which varies during an automatic fine tuning (AFT) control;

AFT circuit means coupled to said voltage-controlled tuner means for producing a control signal when an output carrier frequency of said tuner means substantially coincides with the predetermined intermediate carrier frequency;

clock means for producing AFT clock pulses at each of a plurality of frequencies; wherein said clock means comprises frequency-dividing means for dividing the frequency of a clock pulse to produce a plurality of frequency-divided AFT clock pulses having different frequencies;

AFT counter means connected to said clock means for counting AFT clock pulses during said fine tuning control;

means for suspending counting of said AFT counter means in response to said control signal;

means connected to said counter means and said digital-to-analog conversion means for causing the analog tuning voltage to vary at a rate depending upon the frequency of AFT clock pulses counted; and means connected to said clock means and counter means for switching the AFT clock pulses to a lower frequency during said fine tuning control; wherein said switching means comprises gate circuit means for selectively supplying said frequency-divided AFT clock pulses to said AFT counter; and timer means for determining a timing at which a frequency-divided AFT clock pulse being supplied to said AFT counter through said gate means is switched to another frequency-divided AFT clock pulse having a lower frequency.

3. A channel-selecting apparatus according to claim 1 or 2, wherein said frequency-dividing circuit means comprises cascade-connected binary counters.

4. A channel-selecting apparatus according to claim 2, wherein said timer means is arranged to initiate a timing action in response to initiation of the AFT control and detection of said AFT circuit that the output carrier frequency of said tuner means substantially coincides with the predetermined intermediate carrier frequency.

5. A channel-selecting apparatus according to claims 1 or 2 wherein said digital-to-analog conversion means comprises circuit means for producing a pulse train having a duration which is a function of a digital signal read out of said memory means; and a lowpass filter coupled to said circuit means.

6. A channel-selecting apparatus according to claims 1 or 2, wherein said AFT counter means is so arranged as to act as an up-counter or down counter when said AFT circuit detects that an output carrier frequency of said tuner means is excessively displaced from the predetermined intermediate carrier frequency.

7. An electronic digital channel selecting apparatus comprising:

voltage-controlled tuner means for converting a received carrier frequency to a predetermined intermediate carrier frequency, said tuner means being tunable to carrier frequencies on different channels in response to the application of analog tuning voltages having different magnitudes and controlled to correctly tune to the carrier frequency of a selected channel within a given range by a tuning voltage the magnitude of which varies during an automatic fine tuning (AFT) control;

AFT circuit means coupled to said voltage controlled tuner means for producing a control signal when an output carrier frequency of said tuner means substantially coincides with the predetermined intermediate carrier frequency;

AFT counter means for counting AFT clock pulses during the AFT control and connected to said AFT circuit means, said AFT counter means acting as an up- or down-counter when said AFT circuit means detects that the output carrier frequency of said tuner means is displaced from the predetermined intermediate carrier frequency and being arranged such that its count operation is suspended each time said AFT circuit means produces said control signal;

digital memory means for storing digital signals corresponding to a plurality of channels, a digital signal corresponding to a channel being read out of said memory means in response to selection of the channel;

first circuit means coupled to said digital memory means for producing a tuning pulse train having a predetermined period and a pulse duration which is a function of a digital signal read out of said memory means;

second circuit means for producing an AFT pulse train whose pulse duration is a function of a count number in the AFT counter means and which has the same period as the tuning pulse train, the pulse duration of the AFT pulse train being changed each time said AFT counter means counts an AFT clock pulse;

matrix circuit means for receiving the tuning pulse train upon selection of the channel and for receiving and combining the tuning pulse train and the AFT pulse train during the AFT control;

filter means coupled between said matrix circuit means and said tuner means for producing and coupling to said tuner means an analog tuning voltage having a magnitude which is a function of the pulse duration of the tuning pulse train upon selection of the channel and a tuning voltage whose magnitude varies during the AFT control;

matrix control means connected to said AFT counter means and said AFT circuit means for switching said matrix circuit means from one of the additive and subtractive modes to the other; and means for switching the AFT clock pulses counted to a lower frequency during said fine tuning control.

8. A channel-selecting apparatus according to claim 7, wherein said switching comprises frequency-dividing means for dividing the frequency of clock pulses to produce a plurality of frequency-divided AFT clock pulses having different frequencies; and circuit means responsive to application of said control signal from said AFT circuit means to switch a frequency-divided AFT clock pulse being applied to said AFT counter means to another clock pulse having a lower frequency.

9. A channel-selecting apparatus according to claim 7, wherein said switching means comprises frequency-dividing means for dividing the frequency of a clock pulse to produce a plurality of frequency-divided AFT clock pulses having different frequencies; gate circuit means for selectively supplying said frequency-divided AFT clock pulses to said AFT counter; and timer means for determining a timing at which a frequency-divided AFT clock pulse being supplied to said AFT counter through said gate means is switched to another frequency-divided AFT clock pulse having a lower frequency.

10. A channel-selecting apparatus according to claim 9 or 8, wherein said frequency divider means comprises cascade-connected binary counters.

11. A channel-selecting apparatus according to claim 9, wherein said timer means is arranged to initiate a timing action in response to initiation of the AFT control and detection of said AFT circuit that the output carrier frequency of said tuner means substantially coincides with the predetermined intermediate carrier frequency.

12. A channel-selecting apparatus according to claim 7, wherein said matrix circuit means is arranged to combine the AFT pulse train and tuning pulse train with a smaller amplitude ratio set for the former.

13. A channel-selecting apparatus according to claim 12, wherein the AFT pulse train and the tuning pulse train are combined in a ratio of substantially 2:1.

14. A channel-selecting apparatus according to claim 12, wherein said matrix circuit comprises a first transistor having its collector connected to a first power supply terminal through a first resistor and its emitter connected to a second power supply terminal, and a second transistor having its collector connected to said collector of said first transistor through a second resistor and its emitter connected to said second power supply terminal.

15. A channel-selecting apparatus according to claim 7, wherein said matrix circuit comprises a first transistor having its collector connected to said filter means and to a first power supply terminal through a first resistor and its emitter connected to a second power supply terminal, a second transistor having its collector connected to said collector of said first transistor through a second resistor and its emitter connected to said second power supply terminal, and logic circuit means connected to bases of said first and second transistor, said first and second circuit means, and said matrix control means for coupling, in the subtractive mode, an inverted signal of said tuning pulse train to said base of said first transistor and said AFT pulse train to said base of said second transistor and coupling, in the additive mode, an inverted signal of said tuning pulse train and said AFT pulse train to said base of said first transistor and an inverted signal of said AFT pulse train to said base of said second transistor.

16. A channel-selecting apparatus according to claim 15, wherein said first resistor and said second resistor have a substantially equal value.

* * * * *